United States Patent
Shang et al.

(10) Patent No.: US 12,164,069 B2
(45) Date of Patent: Dec. 10, 2024

(54) DETECTION SUBSTRATE AND RAY DETECTOR

(71) Applicants: Beijing BOE Sensor Technology Co., Ltd., Beijing (CN); BOE Technology Group Co., Ltd., Beijing (CN)

(72) Inventors: Jianxing Shang, Beijing (CN); Jinyu Li, Beijing (CN); Kunjing Chung, Beijing (CN); Jingjie Su, Beijing (CN); Xuecheng Hou, Beijing (CN); Zhenwu Jiang, Beijing (CN); Zhenyu Wang, Beijing (CN); Shenkang Wu, Beijing (CN); Haiyang Lu, Beijing (CN); Jian Ma, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 166 days.

(21) Appl. No.: 17/921,581

(22) PCT Filed: May 12, 2021

(86) PCT No.: PCT/CN2021/093298
§ 371 (c)(1),
(2) Date: Oct. 26, 2022

(87) PCT Pub. No.: WO2021/258884
PCT Pub. Date: Dec. 30, 2021

(65) Prior Publication Data
US 2023/0176238 A1 Jun. 8, 2023

(30) Foreign Application Priority Data
Jun. 23, 2020 (CN) .......................... 202010580774.1

(51) Int. Cl.
*G01T 1/24* (2006.01)
*H01L 27/146* (2006.01)

(52) U.S. Cl.
CPC ........ *G01T 1/247* (2013.01); *H01L 27/14663* (2013.01); *H01L 27/14689* (2013.01)

(58) Field of Classification Search
CPC ..... G01T 1/247; G01T 1/17; H01L 27/14663; H01L 27/14689; H01L 27/14612; H01L 27/14659; H04N 5/32
See application file for complete search history.

(56) References Cited

U.S. PATENT DOCUMENTS

| 2018/0061709 | A1* | 3/2018 | Pai ...................... H01L 27/1259 |
| 2018/0130845 | A1 | 5/2018 | Ko et al. |

(Continued)

FOREIGN PATENT DOCUMENTS

| CN | 106338855 A | 1/2017 |
| CN | 107768390 A | 3/2018 |

(Continued)

OTHER PUBLICATIONS

CN202010580774.1 first office action.
PCT/CN2021/093298 international search report.

*Primary Examiner* — David P Porta
*Assistant Examiner* — Mamadou Faye
(74) *Attorney, Agent, or Firm* — IPro, PLLC

(57) ABSTRACT

Provided are a detection substrate and a ray detector. The detection substrate includes: a base substrate; a plurality of detection pixels located on the base substrate, at least one detection pixel serves as a detection marking pixel. The detection marking pixel includes: a storage capacitor, a first electrode plate of the storage capacitor coupled to a bias voltage end; a discharge circuit configured to write a signal of the bias voltage end into a second electrode plate of the storage capacitor under the control of a first scanning signal (Continued)

end; and a reading circuit coupled to an external reading circuit, the reading circuit configured to write the voltage of the second electrode plate of the storage capacitor into the external reading circuit and write a reference signal of the external reading circuit into the second electrode plate of the storage capacitor under the control of a second scanning signal end.

20 Claims, 13 Drawing Sheets

(56) References Cited

U.S. PATENT DOCUMENTS

| | | | |
|---|---|---|---|
| 2019/0115377 | A1 | 4/2019 | Huang |
| 2020/0049839 | A1 | 2/2020 | Zhang et al. |
| 2021/0223413 | A1 | 7/2021 | Gu et al. |

FOREIGN PATENT DOCUMENTS

| | | | |
|---|---|---|---|
| CN | 109830191 | A | 5/2019 |
| CN | 110854147 | A | 2/2020 |
| CN | 111244122 | A | 6/2020 |
| CN | 111682040 | A | 9/2020 |

\* cited by examiner

DETECTION SUBSTRATE AND RAY DETECTOR

CROSS REFERENCE TO RELATED APPLICATIONS

The present disclosure is a National Stage of International Application No. PCT/CN2021/093298, filed on May 12, 2021, which claims priority to Chinese Patent Application No. 202010580774.1, filed to the China Patent Office on Jun. 23, 2020 and entitled "DETECTION SUBSTRATE AND RAY DETECTOR", the entire contents of which are incorporated herein by reference.

FIELD

The present disclosure relates to the technical field of photoelectric detection, in particular to a detection substrate and a ray detector.

BACKGROUND

The X-radiographic testing technology is widely applied to the fields such as industrial nondestructive testing, container scanning, circuit board inspection, medical treatment, security and protection, and industrial engineering, and has a wide application prospect. The traditional X-Ray imaging technology belongs to analog signal imaging, and is not high in resolution and relatively poor in image quality. The X-ray Digital Radio Graphy (DR), emerged in the late 1990s, uses an X-ray flat detector to directly convert X-ray images into digital images, has become the leading direction of the digital X-ray photography technology, and has been recognized by clinical institutions and imaging experts all over the world due to its obvious advantages such as convenient operation, high imaging speed, high imaging resolution, clear converted digital images, and digital images being easy to save and transmit.

SUMMARY

On one hand, a detection substrate provided by an embodiment of the present disclosure includes: a base substrate; and a plurality of detection pixels, located on the base substrate, wherein at least one detection pixel serves as a detection marking pixel, and the detection marking pixel includes: a storage capacitor, a first electrode plate of the storage capacitor being coupled to a bias voltage end; a discharge circuit, the discharge circuit being configured to write a signal of the bias voltage end into a second electrode plate of the storage capacitor under control of a first scanning signal end; and a reading circuit, coupled to an external reading circuit, the reading circuit being configured to write a voltage of the second electrode plate of the storage capacitor into the external reading circuit and write a reference signal of the external reading circuit into the second electrode plate of the storage capacitor under the control of a second scanning signal end.

Optionally, in the detection substrate provided by embodiments of the present disclosure, the discharge circuit includes: a first transistor, a grid of the first transistor is coupled to the first scanning signal end, a first electrode is coupled to the bias voltage end, and a second electrode is coupled to the second electrode plate of the storage capacitor.

Optionally, in the detection substrate provided by embodiments of the present disclosure, the reading circuit includes: a second transistor, a grid of the second transistor is coupled to the second scanning signal end, a first electrode is coupled to the second electrode plate of the storage capacitor, and a second electrode is coupled to the external reading circuit.

Optionally, in the detection substrate provided by embodiments of the present disclosure, the first transistor includes a first grid, a first active layer, a first source electrode and a first drain electrode arranged at the same layer which are sequentially arranged on the base substrate; and the second transistor includes a second grid arranged at the same layer with the first grid, a second active layer arranged at the same layer with the first active layer, and a second source electrode and a second drain electrode which are arranged at the same layer with the first source electrode and the first drain electrode.

Optionally, the detection substrate provided by embodiments of the present disclosure further includes: a lower electrode, a photoelectric conversion layer, an upper electrode, a flat layer and a bias voltage layer electrically connected with the upper electrode, the lower electrode, the photoelectric conversion layer, the upper electrode, the flat layer and the bias voltage layer are sequentially located on a side, facing away from the base substrate, of the layer where the first source electrode is located; the upper electrode is reused as the first electrode plate of the storage capacitor; and the lower electrode is reused as the second electrode plate of the storage capacitor, and is electrically connected to the first drain electrode and the second source electrode respectively.

Optionally, in the detection substrate provided by embodiments of the present disclosure, an orthographic projection of the photovoltaic conversion layer on the base substrate is located in an orthographic projection of the bias voltage layer.

Optionally, the detection substrate provided by embodiments of the present disclosure further includes: a passivation layer, a flat layer and a bias voltage layer which are sequentially located on a side, facing away from the base substrate, of the layer where the first source electrode is located; the bias voltage layer is reused as the first electrode plate of the storage capacitor; and the second electrode plate of the storage capacitor is located between the passivation layer and the flat layer, and is electrically connected to the first drain electrode and the second source electrode respectively.

Optionally, the detection substrate provided by embodiments of the present disclosure further includes: a passivation layer, a flat layer and a bias voltage layer which are sequentially located on a side, facing away from the base substrate, of the layer where the first source electrode is located; the first electrode plate of the storage capacitor is located between the passivation layer and the flat layer, and is electrically connected to the bias voltage layer; and the second electrode plate of the storage capacitor is arranged at the same layer with the first source electrode, and is electrically connected to the first drain electrode and the second source electrode respectively.

Optionally, the detection substrate provided by embodiments of the present disclosure further includes: a bias voltage layer located on a side, facing away from the base substrate, of the layer where the first source electrode is located, and a grid insulation layer located between the layer where the first grid is located and the first active layer; the first electrode plate of the storage capacitor is arranged at the same layer with the first source electrode, and is electrically connected to the bias voltage layer; and the second electrode plate of the storage capacitor is arranged at the same layer with the first grid, and is electrically connected to the first drain electrode and the second source electrode respectively.

Optionally, in the detection substrate provided by embodiments of the present disclosure, the second grid includes a plurality of sub-grids.

Optionally, in the detection substrate provided by embodiments of the present disclosure, an orthographic projection of the first active layer on the base substrate is located in an orthographic projection of the bias voltage layer.

Optionally, in the detection substrate provided by embodiments of the present disclosure, other detection pixels other than the detection marking pixel include: a third transistor and a photosensitive device located on a side, facing away from the base substrate, of the third transistor; wherein the third transistor includes: a third grid arranged at the same layer with the first grid, a third active layer arranged at the same layer with the first active layer, and a third source electrode and a third drain electrode which are arranged at the same layer with the first source electrode; and the photosensitive device includes: a lower electrode electrically connected to the third source electrode, and a photoelectric conversion layer and an upper electrode which are sequentially located on a side, facing away from the base substrate, of the lower electrode.

Optionally, in the detection substrate provided by embodiments of the present disclosure, a ratio of a capacitance of the storage capacitor to a capacitance of the photosensitive device is 1:10-1:1.

Optionally, in the detection substrate provided by embodiments of the present disclosure, a channel width/length ratio of the third transistor is greater than that of the second transistor.

On the other hand, an embodiment of the present disclosure further provides a ray detector, including the detection substrate.

DETAILED DESCRIPTION OF THE EMBODIMENTS

In order to enable objectives, technical solutions and advantages of the embodiments of the present disclosure more clearly, the technical solutions of the embodiments of the present disclosure will be described clearly and completely in combination with accompanying drawings of the embodiments of the present disclosure below. Thicknesses and shapes of films in the accompanying drawings do not reflect a true scale, and are only intended to illustrate contents of the present disclosure. Apparently, the described embodiments are only a part of the embodiments of the present disclosure, not all of the embodiments. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the specification and claims of the present disclosure do not represent any sequence, quantity or importance, but are used to distinguish different constituent parts. The words "comprise" or "include" and the like indicate that an element or item appearing before such word covers listed elements or items appearing after the word and equivalents thereof, and does not exclude other elements or items. The words "inner", "outer", "upper", "lower" and the like are merely used to represent a relative position relationship, and after an absolute position of a described object changes, the relative position relationship may change accordingly.

Figure 1:
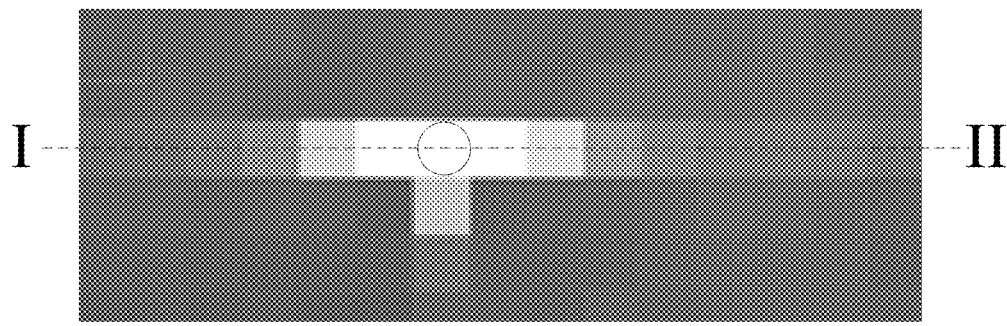
FIG. 1 is a mark effect diagram in the related art.
Figure 2:
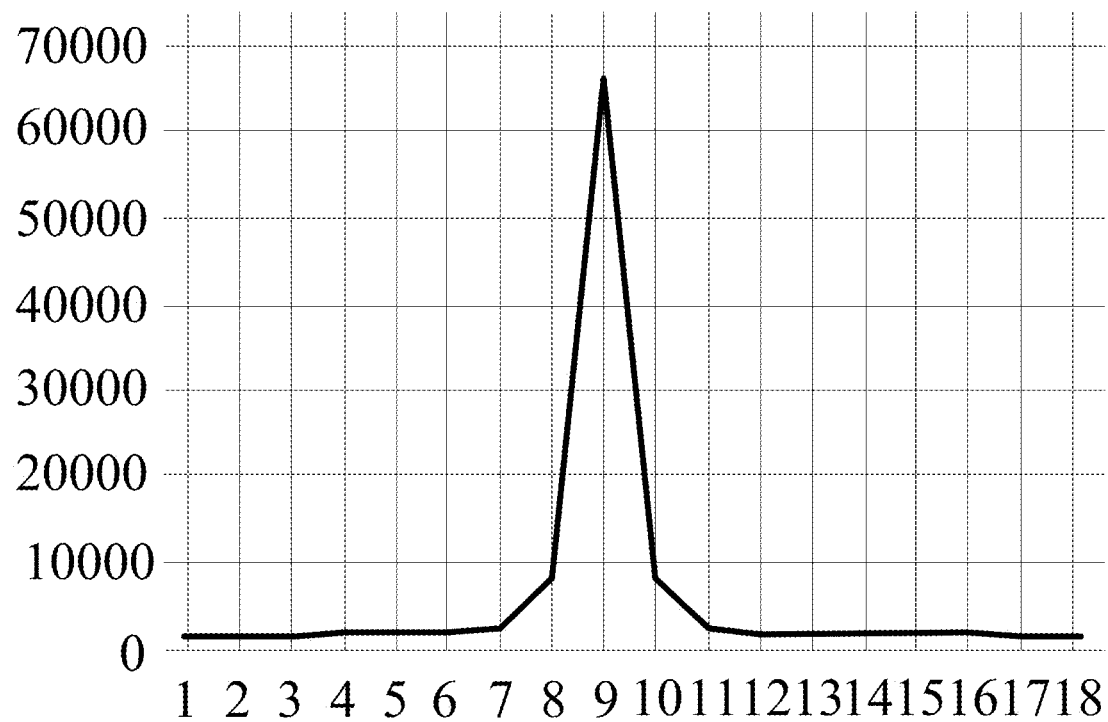
FIG. 2 is a grayscale variation diagram of each detection pixel along an I-II line in FIG. 1.

During new product development, clients put forward that pixels with higher brightness shall be manufactured to serve as detection marking pixels, and configured to mark relative positions. If a method of direct short circuit between an upper electrode and a lower electrode of a PIN-type photosensitive device is used, a grayscale of a Short point (as shown in a circle in FIG. 1) will always be stabilized at 65535@16 bit ROIC, which may be used for manufacturing the Marking pixel. However, when the upper electrode and the lower electrode of the PIN-type photosensitive device are short-circuited, electrons in a bias signal loaded by the upper electrode of the PIN-type photosensitive device will be continuously transferred to an external reading circuit (ROIC), resulting in a lower potential of a reference signal Ref provided by the ROIC, further resulting in crosstalk on the detection pixels near the Marking pixel, and specifically as shown in FIG. 1 and FIG. 2, a grayscale of left and right adjacent detection pixels controlled by a Gate in the same row as the Marking pixel and a grayscale of the detection pixels in the same column at a scanning rear end of the Gate are improved, which presents characteristics of a "T" type.

Figure 3:
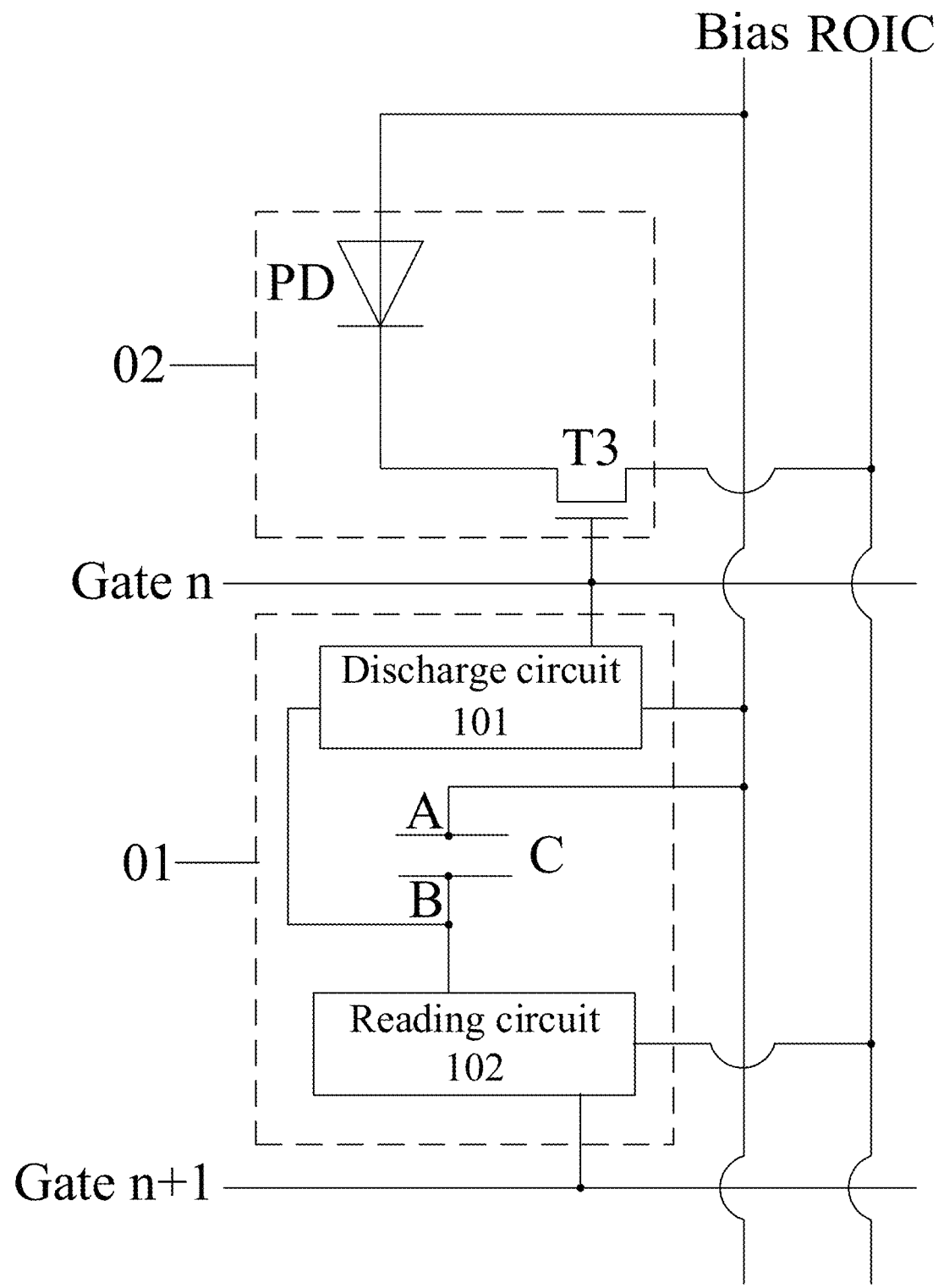
FIG. 3 is a circuit diagram of a detection substrate provided by an embodiment of the present disclosure.

In order to solve the technical problems in the related art, an embodiment of the present disclosure provides a detection substrate, as shown in FIG. 3, including:

a base substrate (not shown in the figure); and a plurality of detection pixels, located on the base substrate (not shown in the figure), wherein at least one detection pixel serves as a detection marking pixel 01, and the detection marking pixel 01 includes:

a storage capacitor C, a first electrode plate A of the storage capacitor C being coupled to a bias voltage end Bias;

a discharge circuit 101, wherein the discharge circuit 101 is configured to write a signal of the bias voltage end Bias into a second electrode plate B of the storage capacitor C under the control of a first scanning signal end Gate n; and a reading circuit 102, coupled to an external reading circuit ROIC, the reading circuit 102 being configured to write the voltage of the second electrode plate B of the storage capacitor C into the external reading circuit ROIC and write a reference signal Ref of the external reading circuit ROIC into the second electrode plate B of the storage capacitor C under the control of a second scanning signal end Gate n+1.

In the detection substrate provided by embodiments of the present disclosure, a capacitance of the storage capacitor C is fixed (the fixed capacitance may be specifically designed in a targeted mode according to brightness requirements, and is smaller than or equal to an upper limit of a charge collected by the external reading circuit ROIC), stored charges are limited, charges transferred into the external reading circuit ROIC through the reading circuit 102 are also limited, therefore, the reference signal Ref of the external reading circuit ROIC will not be affected, and peripheral normal detection pixels will not be affected; and the discharge circuit 101 enables the signal of the bias voltage end Bias to exist on the first electrode plate A and the second electrode plate B of the storage capacitor C, which ensures the high brightness of the detection marking pixels.

A working principle of the detection marking pixels provided by the embodiment of the present disclosure is introduced below in combination with a working sequence diagram and specific embodiments corresponding to the detection marking pixels provided by the embodiment of the present disclosure. In addition, it should be noted that the following is only an example of a specific structure of each module, and during specific implementation, the specific structure of each module is not limited to the following structure provided by the embodiment of the present disclosure, may also be other structures known by those skilled in the art, which is not limited herein.

Figure 4:
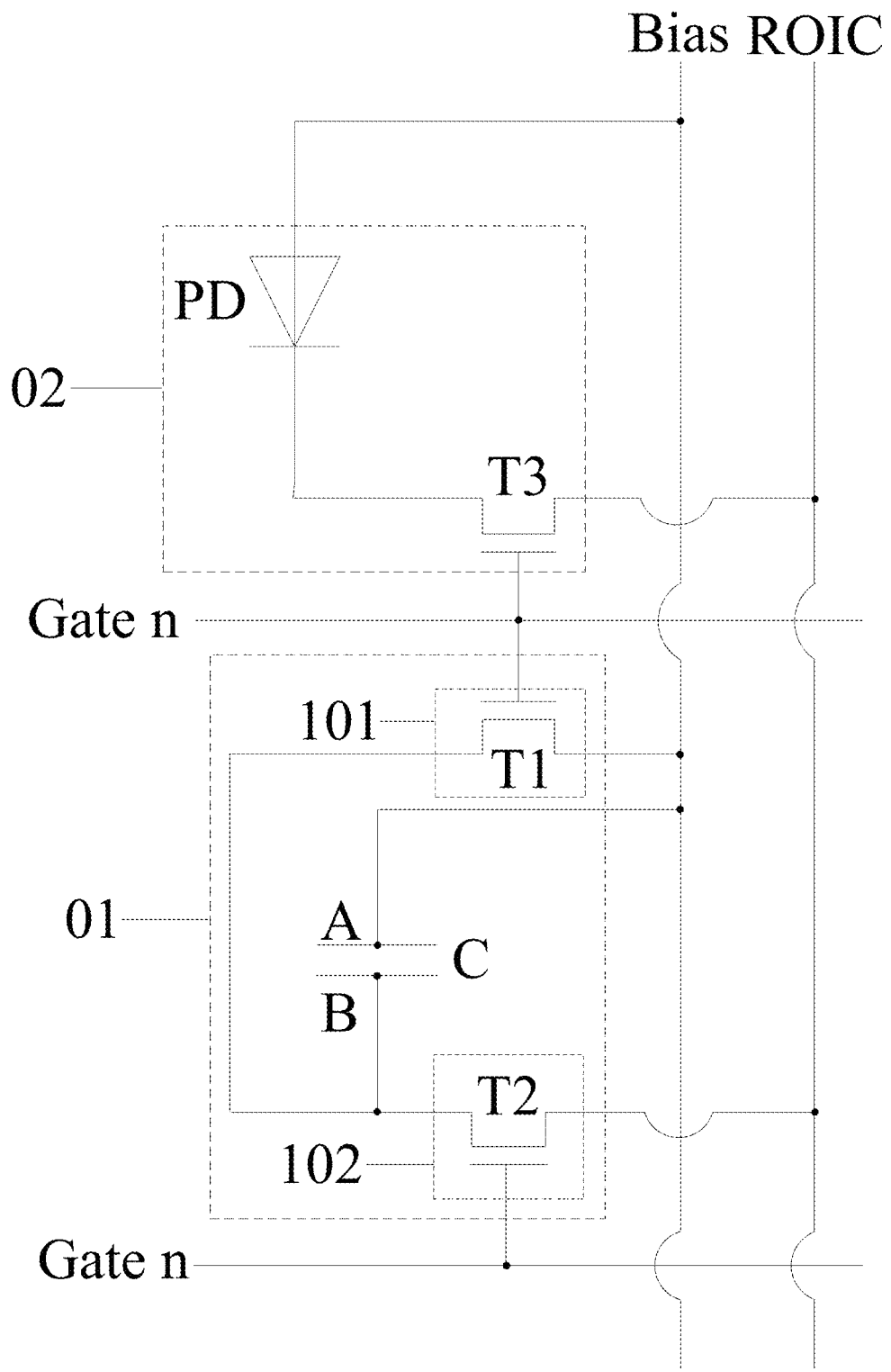
FIG. 4 is a specific circuit diagram of a detection substrate provided by an embodiment of the present disclosure.

Optionally, in the detection substrate provided by embodiments of the present disclosure, as shown in FIG. 4, the discharge circuit 101 includes a first transistor T1, a grid of the first transistor T1 is coupled to the first scanning signal end Gate n, a first electrode is coupled to the bias voltage end Bias, and a second electrode is coupled to the second electrode plate B of the storage capacitor C.

Figure 5:
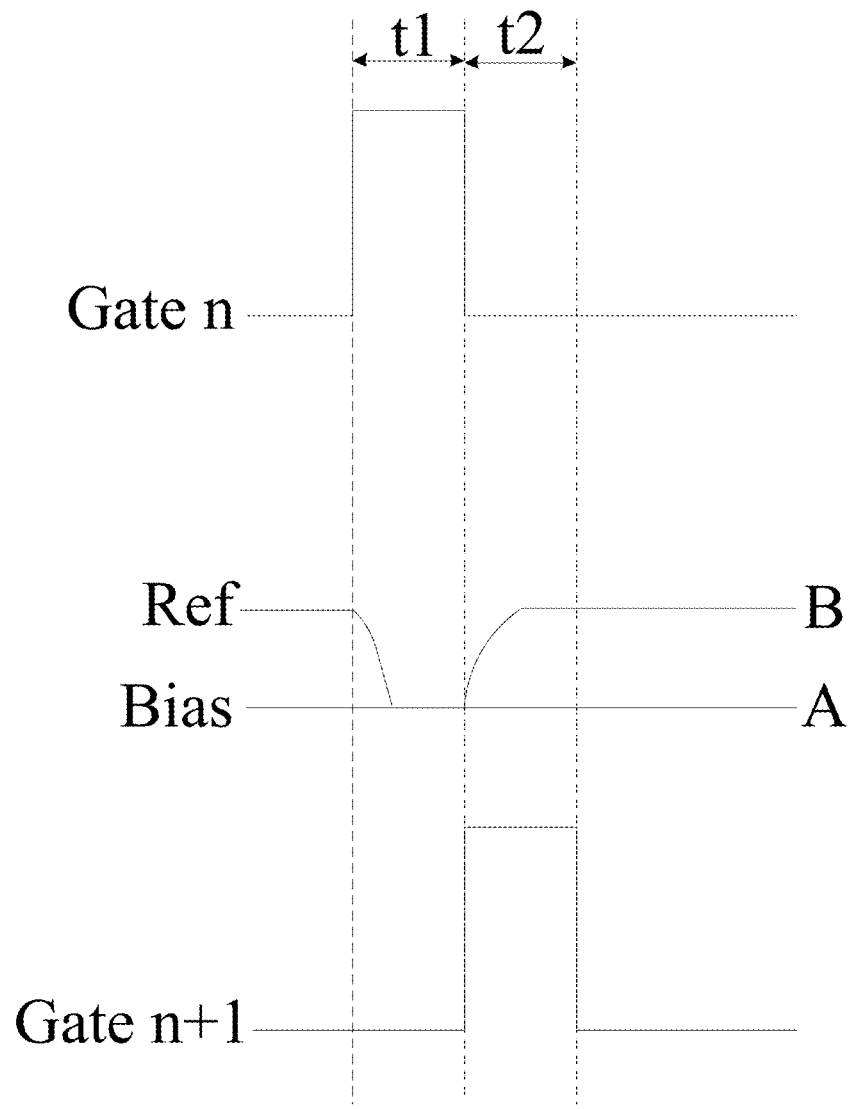
FIG. 5 is a working sequence diagram of detection marking pixels.

In some embodiments, as shown in FIG. 5, in a first phase t1: a signal is loaded on the first scanning signal end Gate n (corresponding to an $n^{th}$ grid line in the detection substrate), so as to enable the first transistor T1 to be in a conducting state, and the signal of the bias voltage end Bias is written into the second electrode plate B of the storage capacitor C through the first conducted first transistor T1, thereby realizing discharging of the storage capacitor. At the same time, the signal of the bias voltage end Bias will be directly loaded on the first electrode plate A of the storage capacitor C.

Optionally, in the detection substrate provided by the embodiment of the present disclosure, as shown in FIG. 4, the reading circuit 102 includes: a second transistor T2, a grid of the second transistor T2 is coupled to the second scanning signal end Gate n+1, a first electrode is coupled to the second electrode plate B of the storage capacitor C, and a second electrode is coupled to the external reading circuit ROIC.

In some embodiments, as shown in FIG. 5, in a second phase t2: a signal is loaded on the second scanning signal end Gate n+1 (corresponding to an $(n+1)^{th}$ grid line in the detection substrate), so as to enable the second transistor T2 to be in a conducting state, the external reading circuit ROIC reads a potential of the second electrode plate B of the storage capacitor C through the second conducted transistor T2, and resets a voltage thereof into a voltage of the reference signal Ref. In conclusion, reading and reset of the Marking Pixel are completed. Existence of the storage capacitor C prevents the external reading circuit from being affected by excessive charges, and normal detection pixels near the Marking Pixel will not be disturbed, thereby presenting a pure bright spot.

It should be noted that in the detection substrate provided by the embodiment of the present disclosure, as shown in FIG. 1 and FIG. 2, other detection pixels (namely normal detection pixels) other than the detection marking pixel may include a PIN-type photosensitive device and a third transistor T3. In some embodiments, when the third transistor T3 is conducted, the external reading circuit ROIC reads a photo-signal of the PIN-type photosensitive device through the conducted third transistor T3 (specifically reads a potential of a lower electrode of the PIN-type photosensitive device), and simultaneously resets the potential of the lower electrode of the PIN-type photosensitive device into the voltage of the reference signal Ref, thereby completing reading and reset of the normal detection pixels. In some embodiments, the PIN-type photosensitive device includes: the lower electrode electrically connected to the third transistor T3, and a photoelectric conversion layer and an upper electrode which are sequentially located on a side, facing away from the base substrate, of the lower electrode; wherein the photoelectric conversion layer is formed by a P-type semiconductor layer, an intrinsic semiconductor layer and an N-type semiconductor layer which are stacked.

In addition, in the detection substrate provided by embodiments of the present disclosure, the transistors are generally made of the same materials, and during specific implementation, in order to simplify a manufacturing process, the first transistor T1, the second transistor T2 and the third transistor T3 all adopt a P-type transistor or an N-type transistor. In addition, first electrodes and second electrodes of the three transistors are respectively source electrodes and drain electrodes, and according to a difference of types of the transistors and input signals, functions thereof may be interchanged, which is not specifically distinguished herein.

In the detection substrate provided by embodiments of the present disclosure, in order to simplify the manufacturing process and save manufacturing costs, films with the same function in the first transistor T1, the second transistor T2 and the third transistor T3 may be arranged at the same layer. In some embodiments, the first transistor T1 includes a first grid, a first active layer, a first source electrode and a first drain electrode arranged at the same layer which are sequentially arranged on the base substrate; the second transistor T2 includes a second grid arranged at the same layer with the first grid, a second active layer arranged at the same layer with the first active layer, and a second source electrode and a second drain electrode arranged at the same layer with the first source electrode and the first drain electrode; and the third transistor T3 includes: a third grid arranged at the same layer with the first grid, a third active layer arranged at the same layer with the first active layer, and a third source electrode and a third drain electrode which are arranged at the same layer with the first source electrode.

Optionally, in the detection substrate provided by embodiments of the present disclosure, there may be various implementations of the storage capacitor C, specifically as follows.

A first possible implementation is that the detection marking pixel may further include: a lower electrode, a photoelectric conversion layer, an upper electrode and a flat layer, and a bias voltage layer electrically connected with the upper electrode, a lower electrode, a photoelectric conversion layer, an upper electrode, a flat layer and a bias voltage layer are sequentially located on a side, facing away from the base substrate, of the layer where the first source electrode is located;

the upper electrode is reused as the first electrode plate A of the storage capacitor C; and the lower electrode is reused as the second electrode plate B of the storage capacitor C, and is electrically connected to the first drain electrode and the second source electrode respectively.

In some embodiments, in the first implementation of the storage capacitor C, the photoelectric conversion layer is equivalent to an insulation layer between the first electrode plate A and the second electrode plate B of the storage capacitor C. In order to prevent gray fluctuation of a detection photoelectric conversion layer due to visible light irradiation, an orthographic projection of the photoelectric conversion layer on the base substrate may be located in an orthographic projection of the bias voltage layer, that is, the bias voltage layer is used for comprehensively covering the photoelectric conversion layer.

A second possible implementation is that the detection marking pixel further includes: a passivation layer, a flat layer and a bias voltage layer which are sequentially located on a side, facing away from the base substrate, of the layer where the first source electrode is located;

the bias voltage layer is reused as the first electrode plate A of the storage capacitor C; and the second electrode plate B of the storage capacitor C is located between the passivation layer and the flat layer, and is electrically connected to the first drain electrode and the second source electrode respectively.

In some embodiments, in the second implementation of the storage capacitor C, the flat layer is equivalent to an insulation layer between the first electrode plate A and the second electrode plate B of the storage capacitor C. At the moment, the normal detection pixel is internally provided with the photoelectric conversion layer, but the detection marking pixel is not internally provided with the photoelectric conversion layer. In some embodiments, when a lower electrode or an upper electrode in the normal detection pixel is manufactured, the upper electrode or the lower electrode is also retained in the detection marking pixel to be reused as the second electrode plate B; or a metal layer is individually additionally arranged in the detection marking pixel to be as the second electrode plate B.

A third possible implementation is that the detection marking pixel further includes: a passivation layer, a flat layer and a bias voltage layer which are sequentially located on a side, facing away from the base substrate, of the layer where the first source electrode is located;

the first electrode plate A of the storage capacitor C is located between the passivation layer and the flat layer, and is electrically connected to the bias voltage layer; and the second electrode plate B of the storage capacitor C is arranged at the same layer with the first source electrode, and is electrically connected to the first drain electrode and the second source electrode respectively.

In some embodiments, in the third implementation of the storage capacitor C, the passivation layer is equivalent to an insulation layer between the first electrode plate A and the second electrode plate B of the storage capacitor C. At the moment, the normal detection pixel is internally provided with the photoelectric conversion layer, but the detection marking pixel is not internally provided with the photoelectric conversion layer. In some embodiments, when the lower electrode or the upper electrode in the normal detection pixel is manufactured, the upper electrode or the lower electrode is also retained in the detection marking pixel to be reused as the first electrode plate A; or a metal layer is individually additionally arranged in the detection marking pixel to be as the first electrode plate A.

A fourth possible implementation is that the detection marking pixel further includes: a bias voltage layer located on a side, facing away from the base substrate, of the layer where the first source electrode is located, and a grid insulation layer located between the layer where the first grid is located and the first active layer;

the first electrode plate A of the storage capacitor C is arranged at the same layer with the first source electrode, and is electrically connected to the bias voltage layer; and the second electrode plate B of the storage capacitor C is arranged at the same layer with the first grid, and is electrically connected to the first drain electrode and the second source electrode respectively.

In some embodiments, in the fourth implementation of the storage capacitor C, the grid insulation layer is equivalent to an insulation layer between the first electrode plate A and the second electrode plate B of the storage capacitor C. At the moment, the normal detection pixel is internally provided with a PIN-type photosensitive device, but the detection marking pixel is not provided with the PIN-type photosensitive device.

Only four possible embodiments for adopting existing films in the detection substrate to be reused as the first electrode plate A and/or the second electrode plate B are shown above, and during specific implementation, the storage capacitor C may further be manufactured by newly additionally arranging two layers of metal, which is not specifically limited herein.

Optionally, in the detection substrate provided by embodiments of the present disclosure, the second transistor T2 is connected to the external reading circuit ROIC through a data line. In order to avoid leakage currents of signals of the bias voltage end Bias (namely the bias voltage layer) to the data line in a discharge process of the detection marking pixel, the second transistor T2 may be arranged to include the second grid which includes a plurality of sub-grids, that is, the second transistor T2 is made into a multi-grid structure.

Optionally, in the detection substrate provided by embodiments of the present disclosure, in order to avoid that normal work of the first transistor T1 is affected during visible light irradiation, it may be arranged that an orthographic projection of the first active layer included in the first transistor T1 on the base substrate is located in the orthographic projection of the bias voltage layer.

Optionally, in the detection substrate provided by embodiments of the present disclosure, in order to avoid that the storage capacitor C provides excessive charges for the external reading circuit ROIC, the capacitance of the storage capacitor C may be set to be smaller. In some embodiments, a ratio of the capacitance of the storage capacitor C to a capacitance of the PIN-type photosensitive device may be 1:10-1:1, such as 1:10, 1:9, 1:8, 1:7, 1:6, 1:5, 1:4, 1:3, 1:2 and 1:1. During specific implementation, the capacitance of the storage capacitor C may be adjusted by changing an effective overlap area of the first electrode plate A and the second electrode plate B, and a thickness and materials of the insulation layer between the first electrode plate A and the second electrode plate B.

Optionally, in the detection substrate provided by embodiments of the present disclosure, since the capacitance of the storage capacitor C included in the detection marking pixel is smaller than the capacitance of the PIN-type photosensitive device included in the normal detection pixel, a channel width/length ratio (W/L) of the second transistor T2 included in the detection marking pixel is smaller than that of the third transistor T3 included in the normal detection pixel, thereby meeting the reading requirement.

In addition, an embodiment of the present disclosure further provides a manufacturing process of the detection substrate, specifically including a manufacturing process of a detection marking pixel, and a normal detection pixel at the same column with the detection marking pixel and located on the previous row thereof, specifically as follows.

Figure 6:
FIG. 6 is a schematic structural diagram of a detection substrate after completion of step 1 in a manufacturing process.

Step 1: a first grid 1011 of a first transistor T1, a second grid 1021 of a second transistor T2, a third grid 201 of a third transistor T3, a first scanning signal end Gate n (namely an $n^{th}$ row grid line) electrically connected to the first grid 1011 and the third grid 201 respectively, and a second scanning signal end Gate n+1 (namely an $(n+1)^{th}$ row scanning signal line) electrically connected to the second grid 1021 are formed on the base substrate, as shown in FIG. 6.

Figure 7:
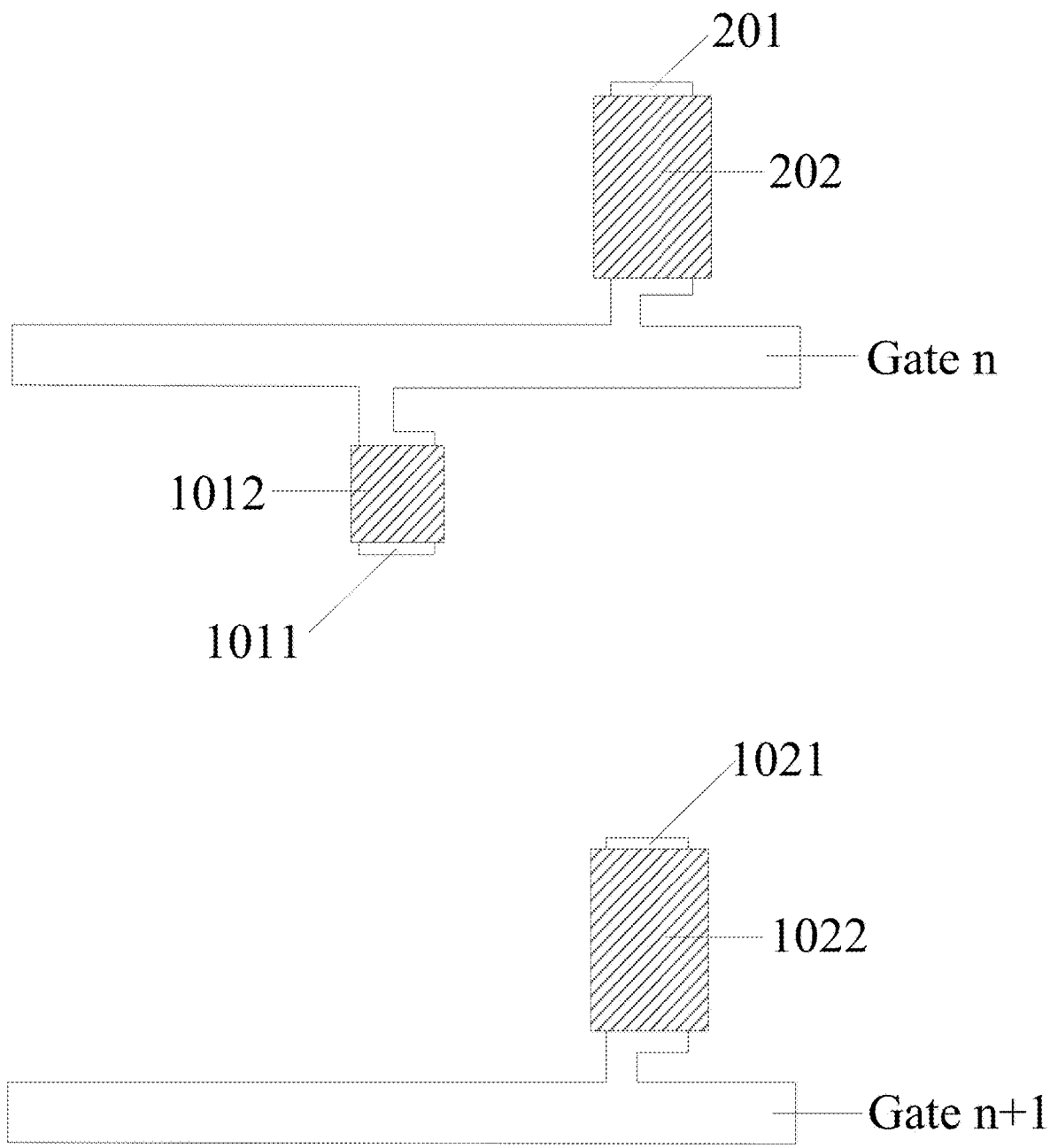
FIG. 7 is a schematic structural diagram of a detection substrate after completion of step 2 in a manufacturing process.

Step 2: a first active layer 1012 of the first transistor T1, a second active layer 1022 of the second transistor T2 and a third active layer 202 of the third transistor T3 are formed on layers where the first grid 1011, the second grid 1021 and the third grid 201 are located, as shown in FIG. 7.

Figure 8:
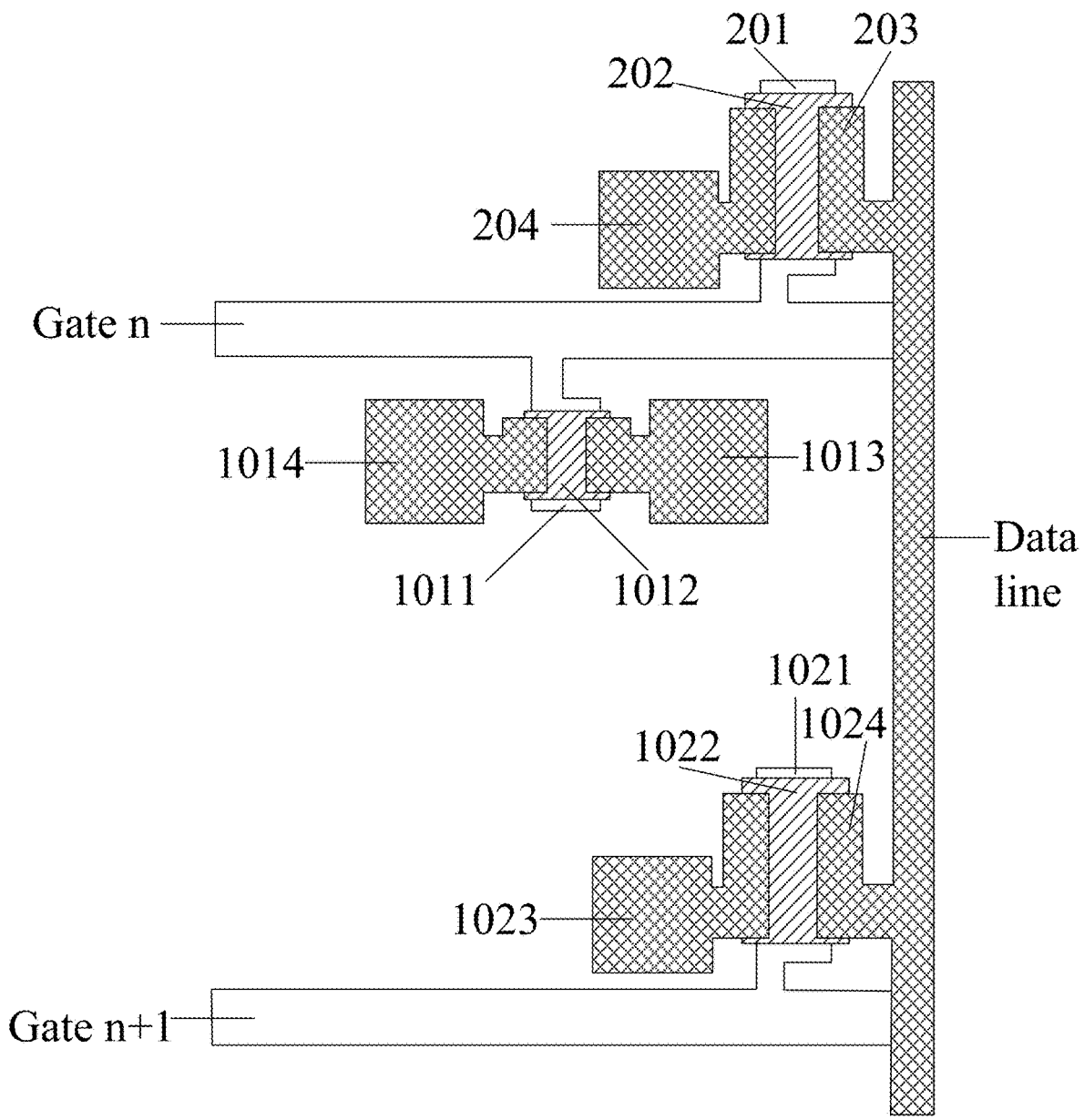
FIG. 8 is a schematic structural diagram of a detection substrate after completion of step 3 in a manufacturing process.

Step 3: a first source electrode 1013 and a first drain electrode 1014 of the first transistor T1, a second source electrode 1023 and a second drain electrode 1024 of the second transistor T2, a third source electrode 203 and a third drain electrode 204 of the third transistor T3, and a data line electrically connected to the second drain electrode 1024 and the third drain electrode 204 respectively are formed on layers where the first active layer 1012, the second active layer 1022 and the third active layer 202 are located, as shown in FIG. 8.

Figure 9:
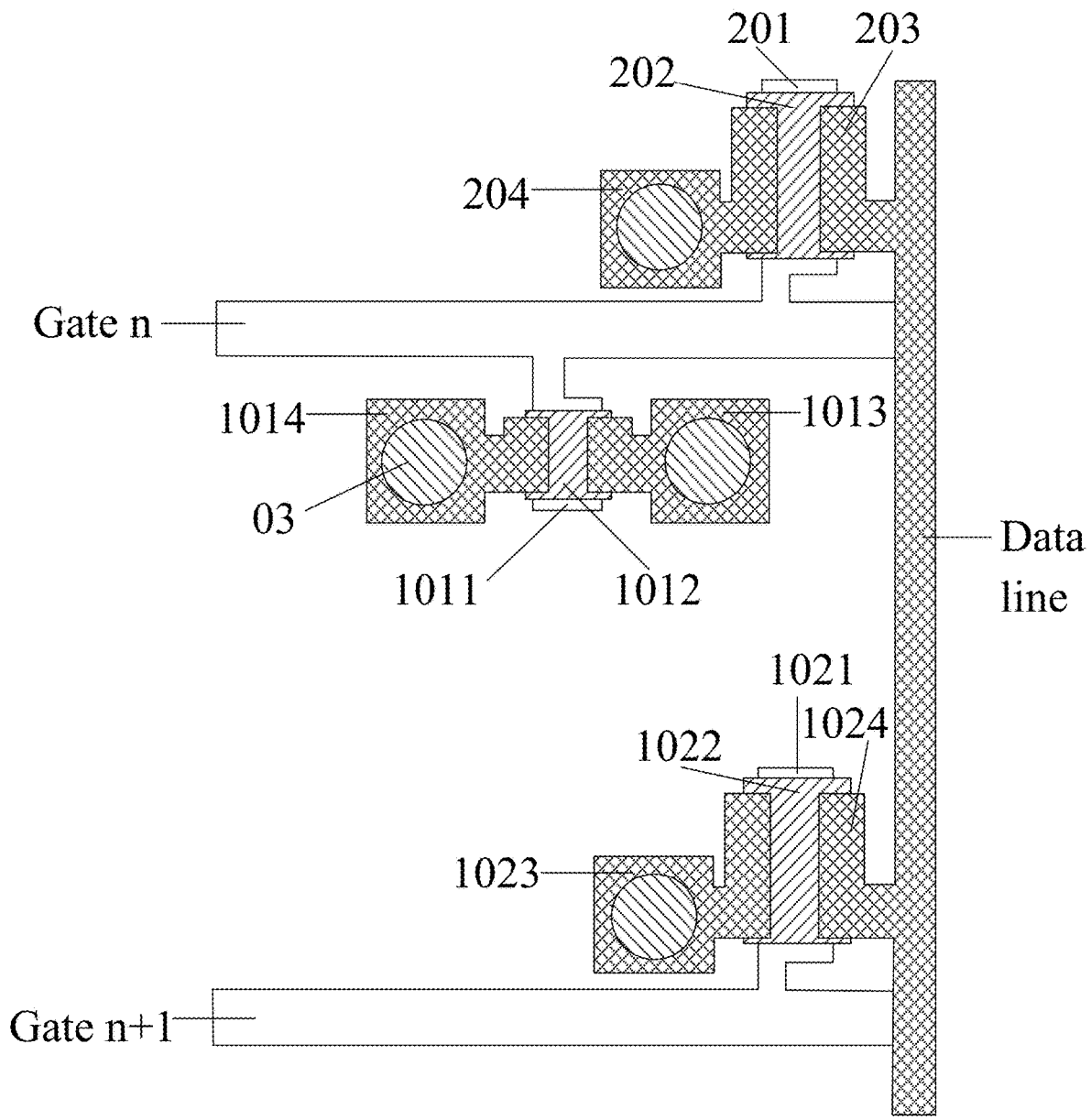
FIG. 9 is a schematic structural diagram of a detection substrate after completion of step 4 in a manufacturing process.

Step 4: a passivation layer 03 arranged in a whole face is formed on layers where the first source electrode 1013, the first drain electrode 1014, the second source electrode 1023, the second drain electrode 1024, the third source electrode 203 and the third drain electrode 204 are located, and a via hole (namely a circular right diagonal fill region in FIG. 9) is formed in the passivation layer 03 corresponding to positions of the first source electrode 1013, the first drain electrode 1014, the second source electrode 1023 and the third drain electrode 204 for subsequent lap joint of films, as shown in FIG. 9.

Figure 10:
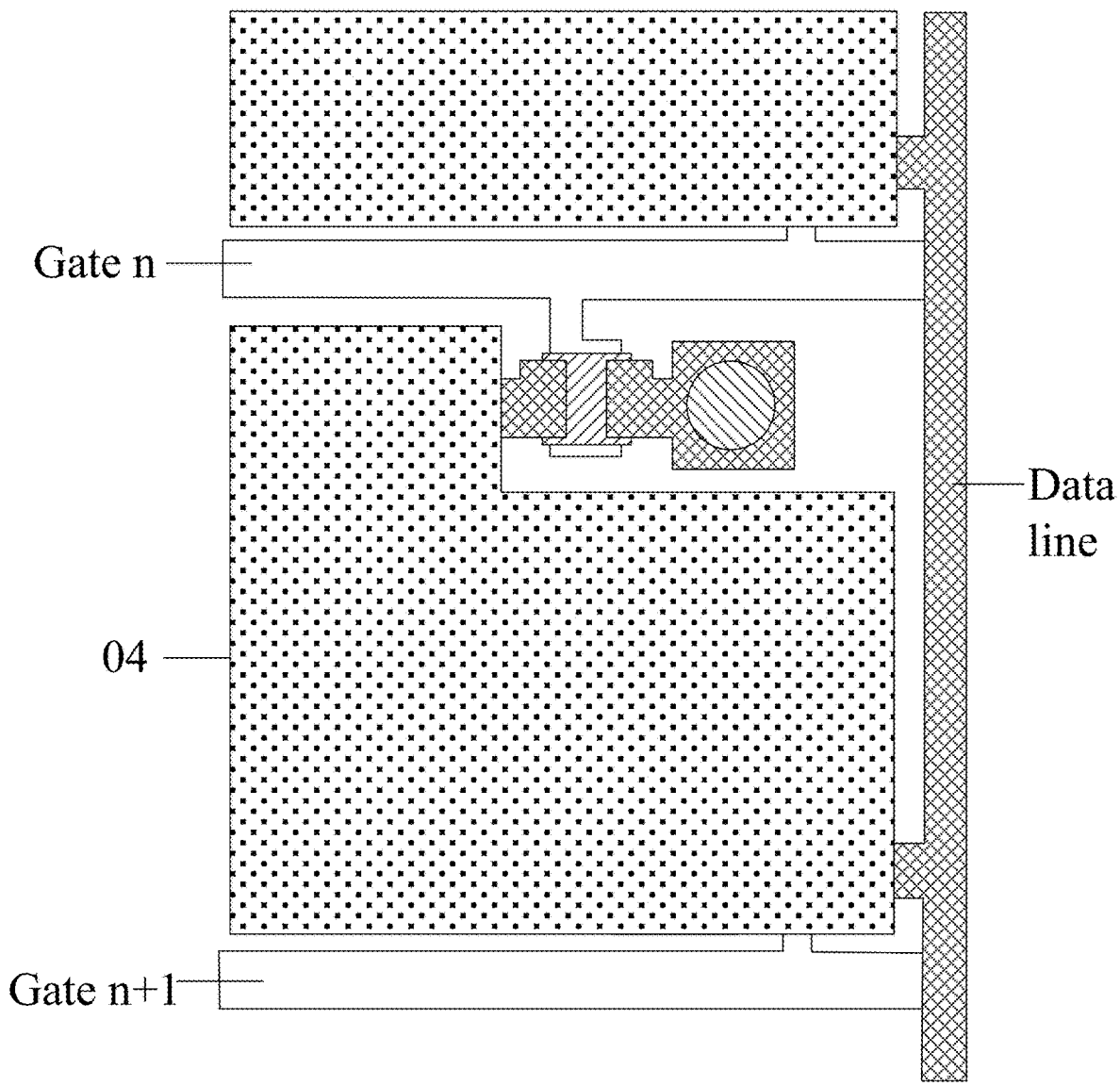
FIG. 10 is a schematic structural diagram of a detection substrate after completion of step 5 in a manufacturing process.

Step 5: a lower electrode 04 is formed on the passivation layer 03, wherein the lower electrode 04 in the detection marking pixel is reused as the second electrode plate B of the storage capacitor C, and the lower electrode 04 is electrically connected to the first drain electrode 1014, the second source electrode 1023 and the third source electrode 203 via the via hole; and in addition, in order to increase an aperture opening ratio, the lower electrode 04 completely covers the second transistor T2 and the third transistor T3, as shown in FIG. 10.

Figure 11:
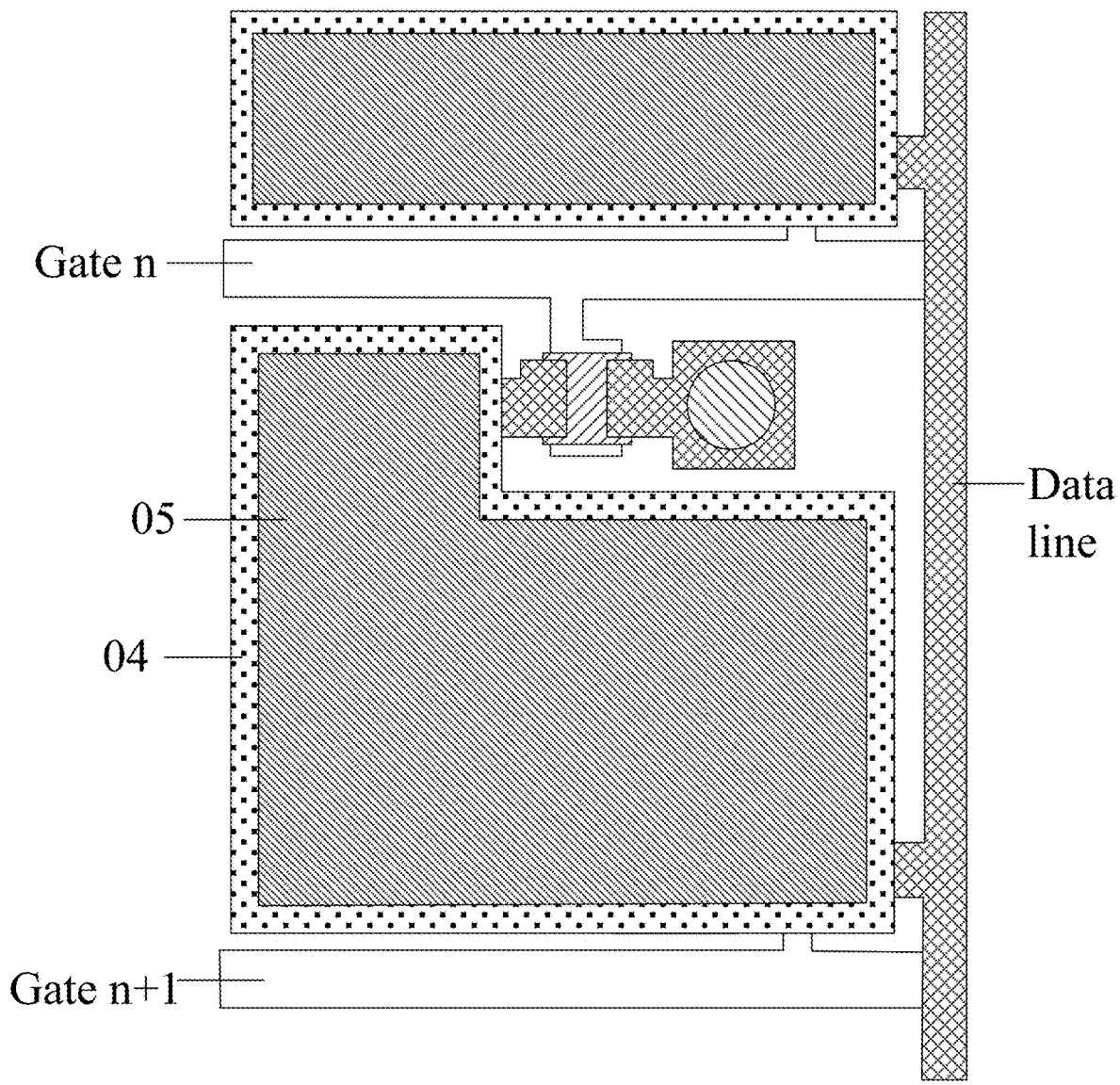
FIG. 11 is a schematic structural diagram of a detection substrate after completion of step 6 in a manufacturing process.

Step 6: a photoelectric conversion layer 05 is formed on the layer where the lower electrode 04 is located, specifically, the photoelectric conversion layer 05 may be indented according to actual process level capability along an outline of the lower electrode 04, that is, an area of the photoelectric conversion layer 05 is smaller than that of the lower electrode 04, as shown in FIG. 11; and in addition, the photoelectric conversion layer 05 in the detection marking pixel is reused as the insulation layer of the storage capacitor C.

Figure 12:
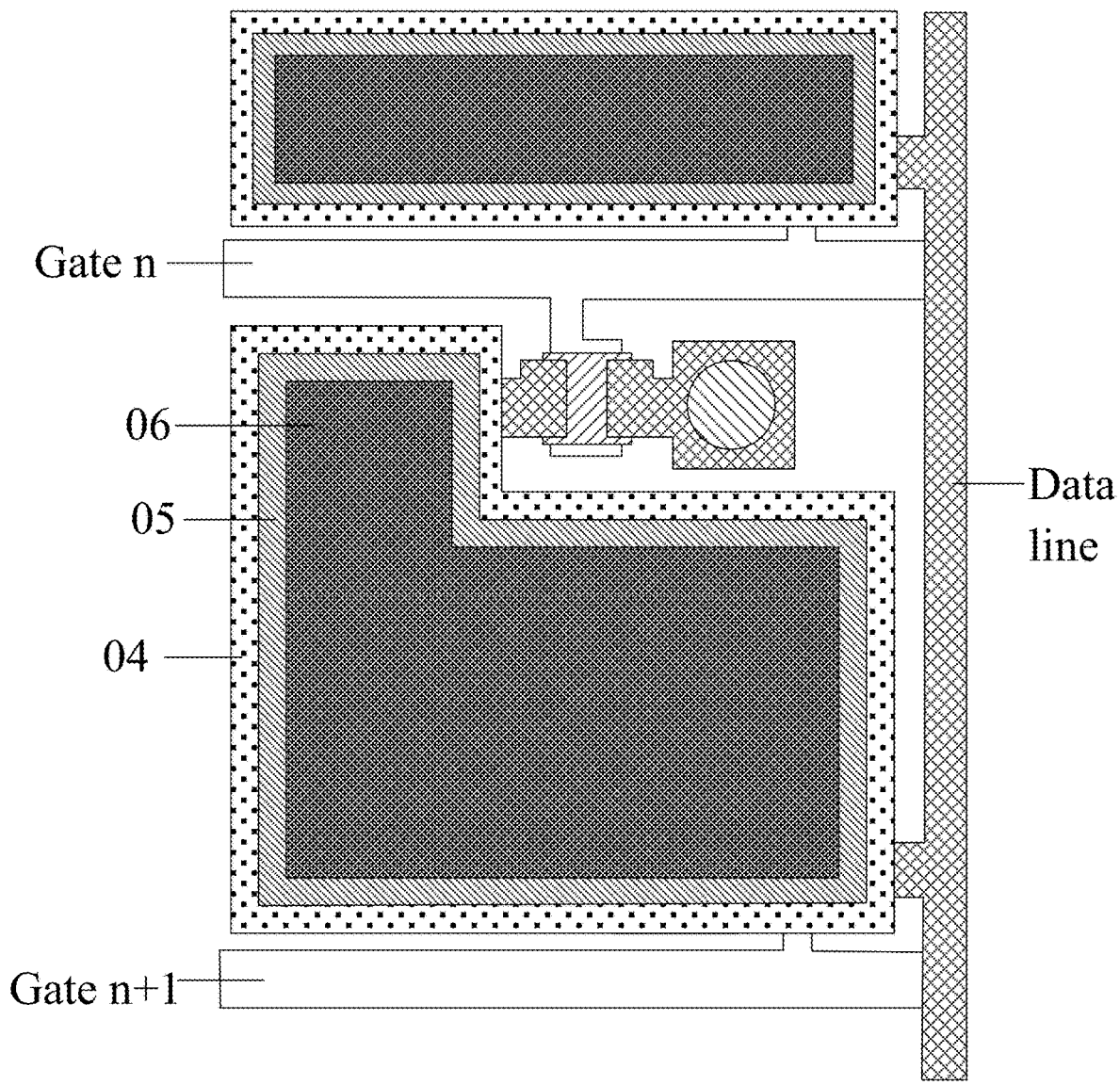
FIG. 12 is a schematic structural diagram of a detection substrate after completion of step 7 in a manufacturing process.

Step 7: an upper electrode 06 is formed on the photoelectric conversion layer 05, specifically, the upper electrode 06 may be indented according to actual process level capability along the outline of the photoelectric conversion layer 05, that is, an area of the upper electrode 06 is smaller than that of the photoelectric conversion layer 05, as shown in FIG. 12; and in addition, the upper electrode 06 in the detection marking pixel is reused as the first electrode plate A of the storage capacitor C.

Figure 13:
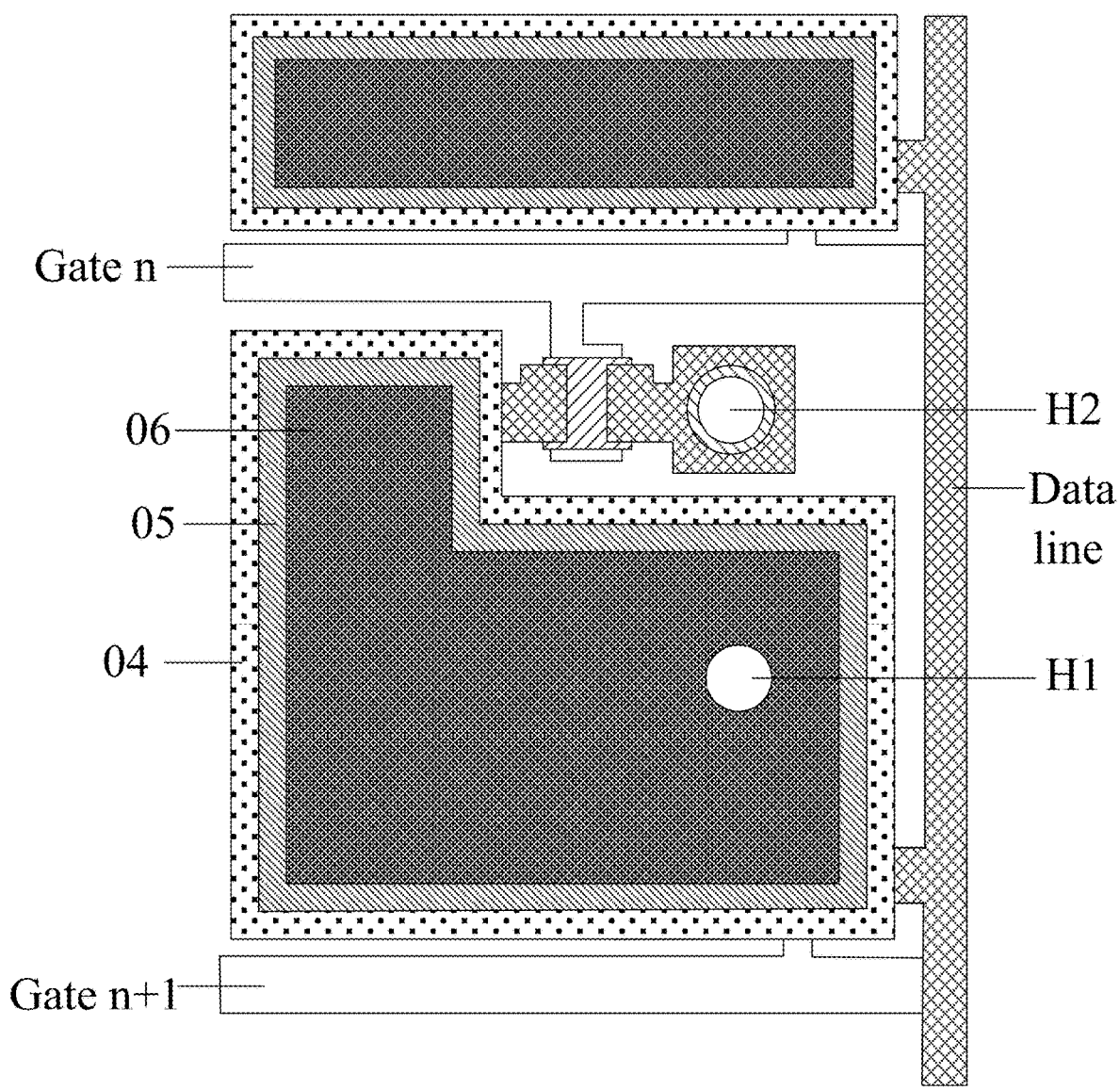
FIG. 13 is a schematic structural diagram of a detection substrate after completion of step 8 in a manufacturing process.

Step 8: a flat layer arranged in a whole face is formed on the layer where the upper electrode 06 is located, the flat layer may specifically include a Resin layer and a dielectric (PVX) layer, a via hole H1 is reserved in a position, corresponding to the upper electrode 06, of the flat layer, and at the same time, a trepanning H2 is formed in the via hole of the passivation hole corresponding to the first source electrode 1013, as shown in FIG. 13.

Figure 14:
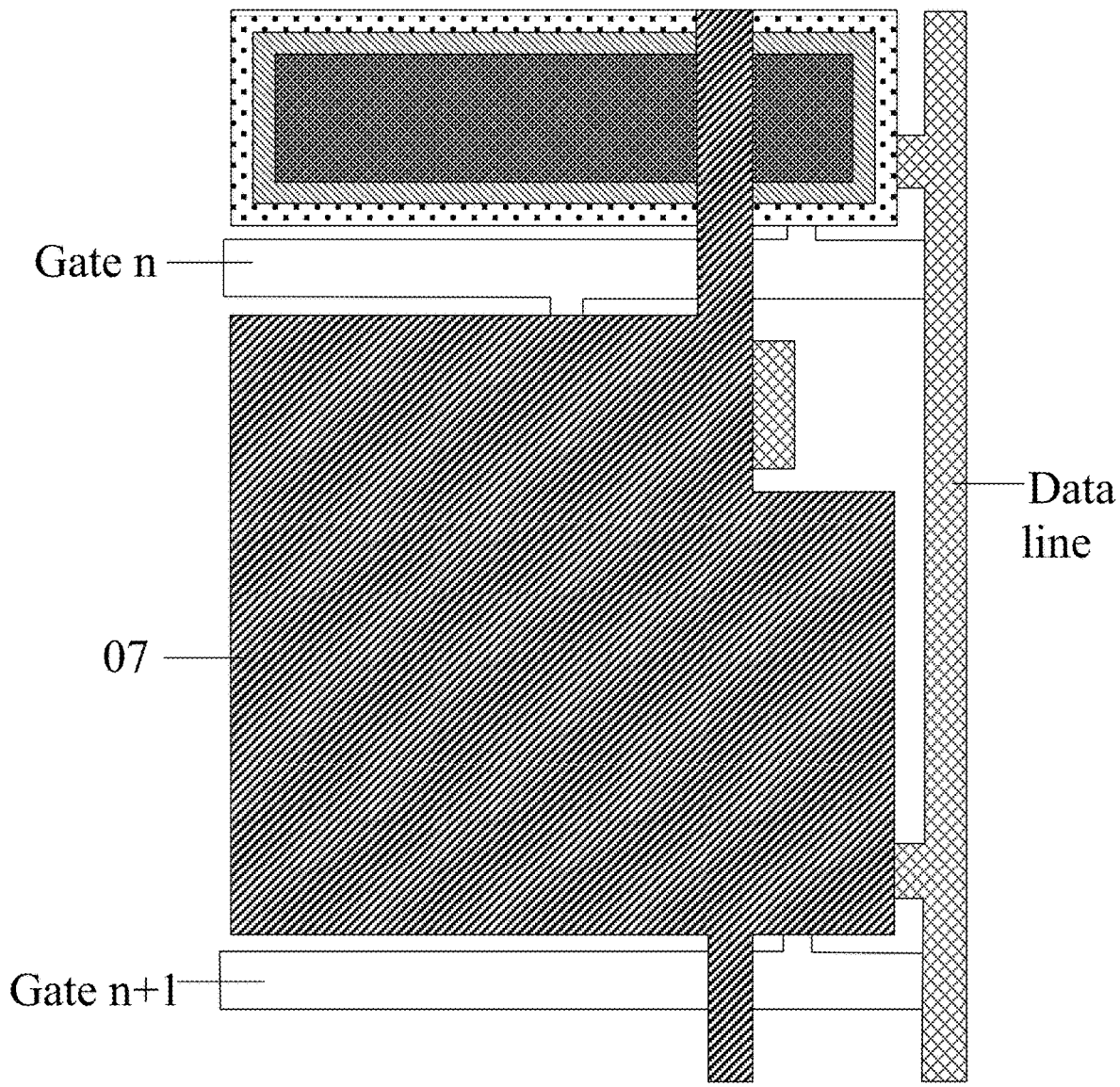
FIG. 14 is a schematic structural diagram of a detection substrate after completion of step 9 in a manufacturing process.

Step 9: a bias voltage layer 07 is formed on the flat layer, so the bias voltage layer 07 is electrically connected to the first source electrode 1013 through the trepanning H2, is electrically connected to the upper electrode 06 through the reserved via hole H1, and completely covers the first active layer 1012 and the photoelectric conversion layer 05 in the detection marking pixel, as shown in FIG. 14; in addition, in the normal detection pixel, the bias voltage layer 07 is electrically connected to the upper electrode 06 through the reserved via hole H1, thus, in order to avoid excessive shielding of the bias voltage layer 07 to the normal detection pixel affecting the aperture opening ratio, the reserved via hole H1 and the trepanning H2 in the detection marking pixel and the reserved via hole H1 in the normal detection pixel may be arranged at the same straight line.

Based on the same inventive concept, an embodiment of the present disclosure further provides a ray detector, including the detection substrate provided by the embodiment of the present disclosure. Other essential constituent parts of the ray detector (such as a scintillator layer) should be understood by those ordinary skilled in the art, which is not repeated herein, and should not limit the present disclosure. In addition, a principle of the ray detector for solving the problem is similar to a principle of the detection substrate for solving the problem, therefore, implementation of the ray detector may refer to the embodiments of the detection substrate, and the repetition is omitted.

According to the detection substrate and ray detector provided by embodiments of the present disclosure, the detection substrate includes: the base substrate; and the plurality of detection pixels, located on the base substrate, wherein at least one detection pixel serves as a detection marking pixel, and the detection marking pixel includes: the storage capacitor, and the first electrode plate of the storage capacitor being coupled to the bias voltage end; the discharge circuit, configured to write the signal of the bias voltage end into the second electrode plate of the storage capacitor under the control of the first scanning signal end; and the reading circuit, coupled to the external reading circuit, and configured to write the voltage of the second electrode plate of the storage capacitor under the control of the second scanning signal end, and write a reference signal of the external reading circuit into the second electrode plate of the storage capacitor. Since the capacitance of the storage capacitor is fixed (the fixed capacitance may be specifically designed in a targeted mode according to brightness requirements, and is smaller than or equal to an upper limit of a charge collected by the external reading circuit), stored charges are limited, charges transferred into the external reading circuit through the reading circuit are also limited, therefore, the reference signal of the external reading circuit will not be affected, and peripheral normal detection pixels will not be affected; and the discharge circuit enables the signal of the bias voltage end to exist on the first electrode plate and the second electrode plate of the storage capacitor, which ensures the high brightness of the detection marking pixels.

It will be apparent to those skilled in the art that various modifications and variations may be made to the embodiments of the present disclosure without departing from the spirit or scope of the present disclosure. In this way, if these modifications and variations of the present disclosure fall within the scope of the claims of the present disclosure and their equivalent art, the present disclosure also intends to include these modifications and variations.

What is claimed is:

1. A detection substrate, comprising:
   a base substrate; and
   a plurality of detection pixels located on the base substrate, wherein at least one of the detection pixel serves as a detection marking pixel, and the detection marking pixel comprises:
   a storage capacitor, a first electrode plate of the storage capacitor being coupled to a bias voltage end;
   a discharge circuit, the discharge circuit being configured to write a signal of the bias voltage end into a second electrode plate of the storage capacitor under control of a first scanning signal end; and
   a reading circuit coupled to an external reading circuit, the reading circuit being configured to write a voltage of the second electrode plate of the storage capacitor into the external reading circuit and write a reference signal of the external reading circuit into the second electrode plate of the storage capacitor under control of a second scanning signal end.

2. The detection substrate according to claim 1, wherein the discharge circuit comprises: a first transistor, a grid of the first transistor being coupled to the first scanning signal end, a first electrode of the first transistor being coupled to the bias voltage end, and a second electrode of the first transistor being coupled to the second electrode plate of the storage capacitor.

3. The detection substrate according to claim 2, wherein the reading circuit comprises: a second transistor, a grid of the second transistor being coupled to the second scanning signal end, a first electrode of the second transistor being coupled to the second electrode plate of the storage capacitor, and a second electrode of the second transistor being coupled to the external reading circuit.

4. The detection substrate according to claim 3, wherein the first transistor comprises a first grid, a first active layer, and a first source electrode and a first drain electrode that are sequentially arranged on the base substrate, the first source electrode and the first drain electrode are at a same layer; and
   the second transistor comprises a second grid arranged at a layer same with a layer where the first grid is, a second active layer arranged at a same layer same with a layer where the first active layer is, and a second source electrode and a second drain electrode arranged at a layer same with a layer where the first source electrode and the first drain electrode are.

5. The detection substrate according to claim 4, further comprising: a lower electrode, a photoelectric conversion layer, an upper electrode, a flat layer, and a bias voltage layer electrically connected with the upper electrode; the lower electrode, the photoelectric conversion layer, the upper electrode, the flat layer and the bias voltage layer are sequentially located on a side, facing away from the base substrate, of the layer where the first source electrode is, wherein
   the upper electrode is reused as the first electrode plate of the storage capacitor; and
   the lower electrode is reused as the second electrode plate of the storage capacitor, and is electrically connected to the first drain electrode and the second source electrode respectively.

6. The detection substrate according to claim 5, wherein an orthographic projection of the photovoltaic conversion layer on the base substrate is located in an orthographic projection of the bias voltage layer.

7. The detection substrate according to claim 4, further comprising: a passivation layer, a flat layer and a bias voltage layer which are sequentially located on a side, facing away from the base substrate, of the layer where the first source electrode is; wherein
   the bias voltage layer is reused as the first electrode plate of the storage capacitor; and
   the second electrode plate of the storage capacitor is between the passivation layer and the flat layer, and is electrically connected to the first drain electrode and the second source electrode respectively.

8. The detection substrate according to claim 4, further comprising: a passivation layer, a flat layer and a bias voltage layer sequentially located on a side, facing away from the base substrate, of the layer where the first source electrode is; wherein
   the first electrode plate of the storage capacitor is between the passivation layer and the flat layer, and is electrically connected to the bias voltage layer; and
   the second electrode plate of the storage capacitor is arranged at a layer same with a layer where the first source electrode is, and is electrically connected to the first drain electrode and the second source electrode respectively.

9. The detection substrate according to claim 4, further comprising: a bias voltage layer located on a side, facing away from the base substrate, of the layer where the first source electrode is, and a grid insulation layer located between the layer where the first grid is and the first active layer; wherein
   the first electrode plate of the storage capacitor is arranged at a layer same with the layer where the first source electrode is, and is electrically connected to the bias voltage layer; and the second electrode plate of the storage capacitor is arranged at a layer same with the layer where the first grid is, and is electrically connected to the first drain electrode and the second source electrode respectively.

10. The detection substrate according to claim 4, wherein the second grid comprises a plurality of sub-grids.

11. The detection substrate according to claim 5, wherein an orthographic projection of the first active layer on the base substrate is located in an orthographic projection of the bias voltage layer.

12. The detection substrate according to claim 4, wherein detection pixels other than the detection marking pixel, comprise: a third transistor and a photosensitive device located on a side, facing away from the base substrate, of the third transistor; wherein
   the third transistor comprises: a third grid arranged at a layer same with the layer where the first grid is, a third active layer arranged at a layer same with the layer where the first active layer is, and a third source electrode and a third drain electrode arranged at a layer same with the layer where the first source electrode is; and
   the photosensitive device comprises: a lower electrode electrically connected to the third source electrode, a photoelectric conversion layer and an upper electrode, the photoelectric conversion layer and the upper electrode are sequentially located on a side, facing away from the base substrate, of the lower electrode.

13. The detection substrate according to claim 12, wherein a ratio of a capacitance of the storage capacitor to a capacitance of the photosensitive device is 1:10-1:1.

14. The detection substrate according to claim 13, wherein a channel width/length ratio of the third transistor is greater than a channel width/length ratio of the second transistor.

15. A ray detector, comprising a detection substrate, wherein the detect substrate comprises:
   a base substrate; and
   a plurality of detection pixels located on the base substrate, wherein at least one of the detection pixel serves as a detection marking pixel, and the detection marking pixel comprises:
   a storage capacitor, a first electrode plate of the storage capacitor being coupled to a bias voltage end;
   a discharge circuit, the discharge circuit being configured to write a signal of the bias voltage end into a second electrode plate of the storage capacitor under control of a first scanning signal end; and
   a reading circuit coupled to an external reading circuit, the reading circuit being configured to write a voltage of the second electrode plate of the storage capacitor into the external reading circuit and write a reference signal of the external reading circuit into the second electrode plate of the storage capacitor under control of a second scanning signal end.

16. The ray detector according to claim 15, wherein the discharge circuit comprises: a first transistor, a grid of the first transistor being coupled to the first scanning signal end, a first electrode of the first transistor being coupled to the bias voltage end, and a second electrode of the first transistor being coupled to the second electrode plate of the storage capacitor.

17. The ray detector according to claim 16, wherein the reading circuit comprises: a second transistor, a grid of the second transistor being coupled to the second scanning signal end, a first electrode of the second transistor being coupled to the second electrode plate of the storage capacitor, and a second electrode of the second transistor being coupled to the external reading circuit.

18. The ray detector according to claim 17, wherein the first transistor comprises a first grid, a first active layer, and a first source electrode and a first drain electrode that are sequentially arranged on the base substrate, the first source electrode and the first drain electrode are at a same layer; and
   the second transistor comprises a second grid arranged at a layer same with a layer where the first grid is, a second active layer arranged at a same layer same with a layer where the first active layer is, and a second source electrode and a second drain electrode arranged at a layer same with a layer where the first source electrode and the first drain electrode are.

19. The ray detector according to claim 18, wherein the detection substrate further comprising: a lower electrode, a photoelectric conversion layer, an upper electrode, a flat layer, and a bias voltage layer electrically connected with the upper electrode; the lower electrode, the photoelectric conversion layer, the upper electrode, the flat layer and the bias voltage layer are sequentially located on a side, facing away from the base substrate, of the layer where the first source electrode is, wherein
   the upper electrode is reused as the first electrode plate of the storage capacitor; and
   the lower electrode is reused as the second electrode plate of the storage capacitor, and is electrically connected to the first drain electrode and the second source electrode respectively.

20. The ray detector according to claim 19, wherein an orthographic projection of the photovoltaic conversion layer on the base substrate is located in an orthographic projection of the bias voltage layer.

\* \* \* \* \*